United States Patent [19]

Ozaki

[11] Patent Number: 5,093,761

[45] Date of Patent: Mar. 3, 1992

[54] CIRCUIT BOARD DEVICE

[75] Inventor: Risuke Ozaki, Kokubunji, Japan

[73] Assignee: O.K Print Corporation, Tokyo, Japan

[21] Appl. No.: 495,158

[22] Filed: Mar. 19, 1990

[30] Foreign Application Priority Data

Aug. 21, 1989 [JP] Japan .................. 1-213091

[51] Int. Cl.⁵ .......................... H05K 1/11; H05K 1/14
[52] U.S. Cl. .................... 361/414; 361/397;
361/398; 361/412; 428/901; 174/266
[58] Field of Search ............. 174/250, 259, 266;
361/397, 398, 412, 414, 380, 381, 395, 399, 400,
415; 427/96; 428/901

[56]  References Cited

U.S. PATENT DOCUMENTS

| | | | |
|---|---|---|---|
| 3,680,209 | 8/1972 | Hacker | 29/625 |
| 3,926,360 | 12/1975 | Moister, Jr. | 228/180 |
| 4,528,064 | 7/1985 | Ohsawa et al. | 156/630 |
| 4,550,357 | 10/1985 | Matsumoto | 361/398 |
| 4,663,208 | 5/1987 | Ninomiya et al. | 428/138 |
| 4,687,695 | 8/1987 | Hamby | 428/192 |
| 4,800,461 | 1/1989 | Dixon et al. | 361/398 |
| 4,803,450 | 2/1989 | Burgess et al. | 333/238 |
| 4,860,165 | 8/1989 | Cassinelli | 361/388 |

*Primary Examiner*—Leo P. Picard
*Assistant Examiner*—Bot Lee Ledynh
*Attorney, Agent, or Firm*—Birch, Stewart, Kolasch & Birch

[57]  ABSTRACT

A circuit board device includes a flexible circuit board, a rigid circuit board bonded to at least a part of the flexible circuit board, and a metal plate bonded to at least one of the rigid circuit board and a portion of the flexible circuit board which is itself bonded to the rigid circuit board. Heat generated from components mounted on the rigid circuit board is dissipated through the metal plate to a frame, for example.

3 Claims, 2 Drawing Sheets

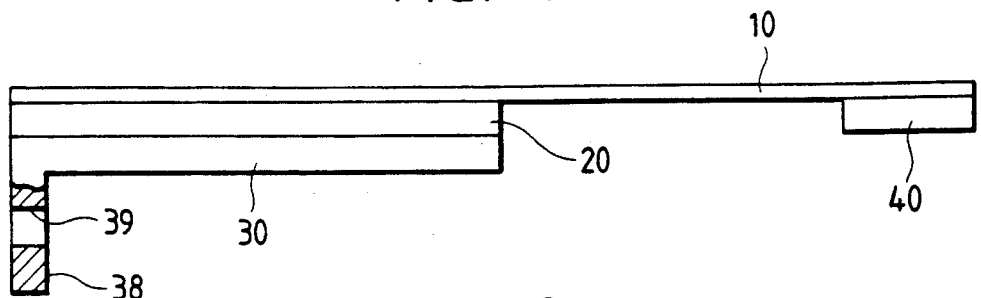
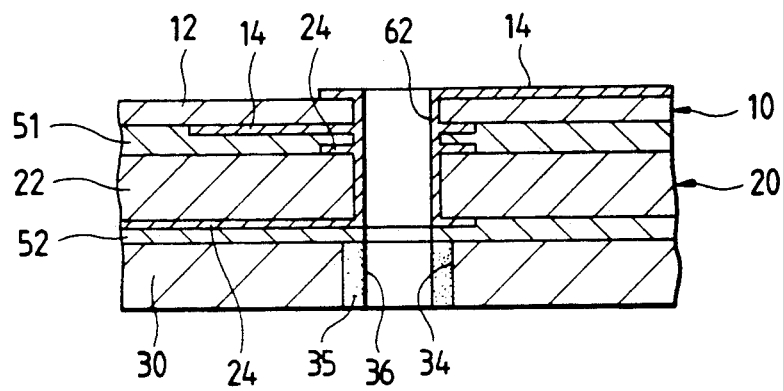
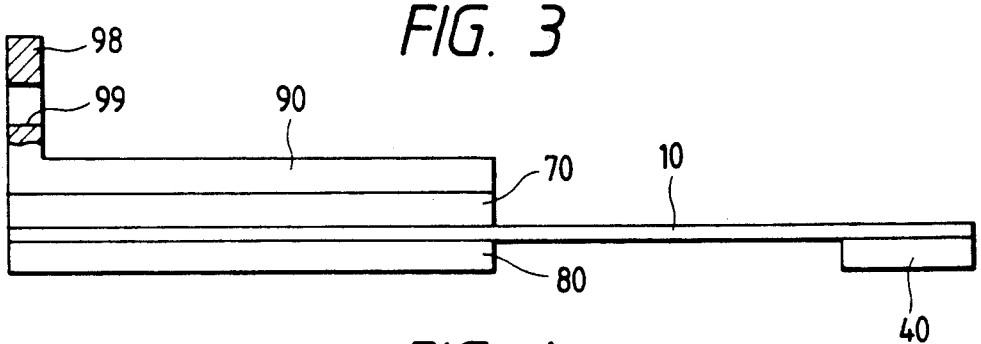
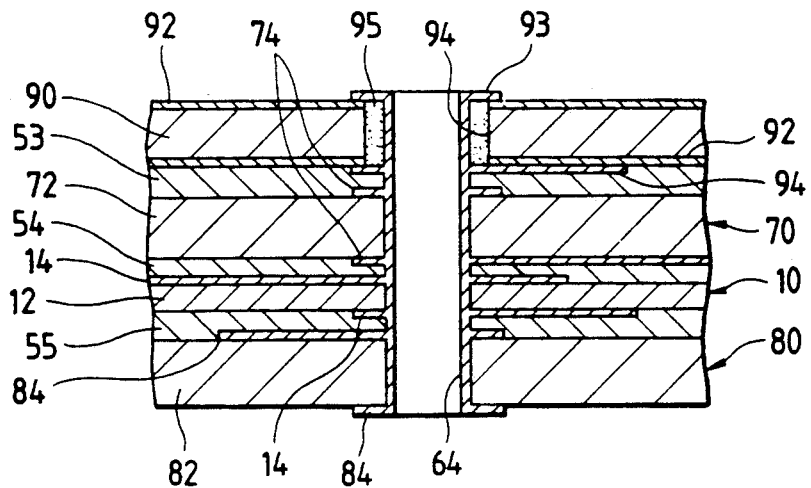

CIRCUIT BOARD DEVICE

BACKGROUND OF THE INVENTION

1. Field of the Invention

The present invention relates to a circuit board device having a flexible circuit board and a rigid circuit board bonded to at least a part of the flexible circuit board,.

2. Description of the Prior Art

In a conventional circuit board device, a rigid circuit board having a resin plate formed with a circuit layer is mounted to one end portion of a flexible circuit board.

When mounting heat generating components on the rigid circuit board in such a circuit board device, there is a possibility that the components, the flexible circuit board and the rigid circuit board will be damaged by the heat generated from the components.

SUMMARY OF THE INVENTION

It is an object of the present invention to provide a circuit board device which will eliminate the possibility of damage of the components, the circuit board and the rigid circuit board.

According to the present invention, there is provided a circuit board device comprising a flexible circuit board, a rigid circuit board bonded to at least a part of said flexible circuit board, and a metal plate bonded to at least one of said rigid circuit board and a portion of said flexible circuit board bonded to said rigid circuit board.

In the circuit board device as mentioned above, heat radiation performance is improved due to the metal plate. Accordingly, when mounting heat generating components on the rigid circuit board, there is no possibility that the components, the flexible circuit board and the rigid circuit board will be damaged by the heat generated from the components. Therefore, high-density wiring can be obtained, and circuit designing can be freely carried out.

BRIEF DESCRIPTION OF THE DRAWINGS

FIG. 1 is a schematic view showing a first preferred embodiment of the circuit board device according to the present invention;

FIG. 2 is a sectional view of a part of the circuit board device shown in FIG. 1;

FIG. 3 is a schematic view showing a second preferred embodiment of the circuit board device according to the present invention;

FIG. 4 is a sectional view of a part of the circuit board device shown in FIG. 3;

DETAILED DESCRIPTION OF THE INVENTION

Figure 5:
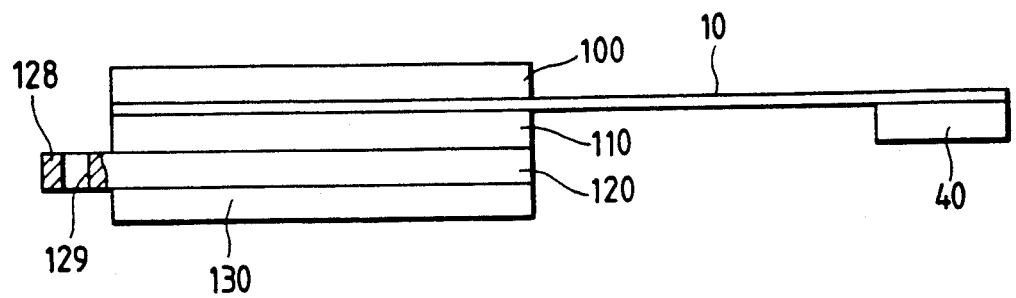
FIG. 5 is a schematic view showing a third preferred embodiment of the circuit board device according to the present invention.

Referring to FIGS. 1 and 2 which show a first preferred embodiment of the circuit board device according to the present invention, a rigid circuit board 20 is bonded to one end portion of a flexible circuit board 10 by adhesive 51, and a metal plate 30 is bonded to the rigid circuit board 20 by adhesive 52. Another rigid circuit board 40 is bonded to the other end portion of the flexible circuit board 10. A resin plate 12 of the flexible circuit board 10 is formed on its opposite surfaces with circuit layers 14, and a resin plate 22 of the rigid circuit board 20 is formed on its opposite surfaces with circuit layers 24. The circuit layers 14 and 24 are connected together by through-holes 62. The metal plate 30 is formed with resin holes 34, and resin 35 is filled in the resin hole 34. The resin 35 is formed at its center with a lead wire hole 36. A center line of the lead wire hole 36 coincides with a center line through-hole 62. The metal plate 30 is formed at its one end with an offset portion 38 having a mounting hole 39.

In the first preferred embodiment of the circuit board device as mentioned above, heat radiation performance is improved due to the metal plate 30. Accordingly, when mounting heat generating components on the rigid circuit board 20, there is no possibility that the components, the flexible circuit board 10 and the rigid circuit board 20 will be damaged by the heat generated from the components. Therefore, high-density wiring can be obtained, and circuit designing can be freely carried out. Further, when the offset portion 38 is mounted to a frame (not shown), the heat generated from the components can be dissipated through the metal plate 30 to the frame, thereby effectively preventing the damage of the flexible circuit board 10, etc.

Referring to FIGS. 3 and 4 which show a second preferred embodiment of the circuit board device according to the present invention, a rigid circuit board 70 is bonded to one end portion of a flexible circuit board 10 on one side thereof by adhesive 54, and another rigid circuit board 80 is bonded to one end portion of the flexible circuit board 10 on the other side thereof by adhesive 55. A metal plate 90 is bonded to the rigid circuit board 70 by adhesive 53. A resin plate 72 of the rigid circuit board 70 is formed on its opposite surfaces with circuit layers 74, and a resin plate 82 of the rigid circuit board 80 is formed on its opposite surfaces with circuit layers 84. The metal plate 90 is formed on its opposite surfaces with insulator layers 92, and circuit layers 93 are formed on the insulator layers 92. The metal plate 90 is formed with resin holes 94, and resin 95 is filled in the resin hole 94. The circuit layers 14, 74, 84 and 93 are connected together by through-holes 64. The through-hole 64 passes through a central portion of the resin 95. The metal plate 90 is formed at its one end with offset portion 98 having a mounting hole 99.

In the second preferred embodiment of the circuit board device as mentioned above, heat radiation performance is improved due to the metal plate 90. Accordingly, when mounting heat generating components on the rigid circuit boads 70 and 80, there is no possibility that the components, the flexible circuit board 10 and the rigid circuit boards 70 and 80 will be damaged by the heat generated from the components. Therefore, high-density wiring can be obtained, and circuit designing can be freely carried out. Further, when the offset portion 98 is mounted to a frame (not shown), the heat generated from the components can be dissipated through the metal plate 90 to the frame, thereby effectively preventing the damage of the flexible circuit board 10, etc.

Figure 6:
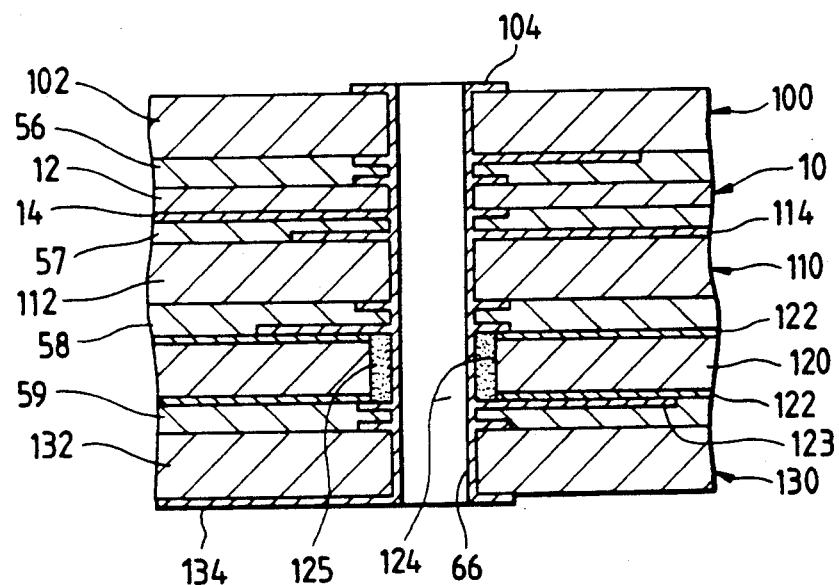
FIG. 6 is a sectional view of a part of the circuit board device shown in FIG. 5.

Referring to FIGS. 5 and 6 which show a third preferred embodiment of the circuit board device according to the present invention, a first rigid circuit board 100 is bonded to one end portion of a flexible circuit board 10 on one side thereof by adhesive 56, and a second rigid circuit board 110 is bonded to one end portion of the flexible circuit board 10 on the other side thereof by adhesive 57. A metal plate 120 is bonded to the second rigid circuit board 110 by adhesive 58. A third rigid circuit board 130 is bonded to the metal plate 120 by adhesive 59. A resin plate 102 of the first rigid circuit board 100 is formed on its opposite surfaces with circuit layers 104, and a resin plate 112 of the second rigid circuit board 110 is formed on its opposite surfaces with circuit layers 114. The metal plate 120 is formed on its opposite surfaces with insulator layers 122, and circuit layers 123 are formed on the insulator layers 122. The metal plate 120 is formed with resin holes 124, and resin 125 is filled in the resin hole 124. A resin plate 132 of the third rigid circuit board 130 is formed on its opposite surfaces with circuit layers 134. The circuit layers 14, 104, 114, 123 and 134 are connected together by through-holes 66. The through-hole 66 passes through a central portion of the resin 125. The metal plate 120 is formed at its one end with a projecting portion 128 having a mounting hole 129.

In the third preferred embodiment of the circuit board device as mentioned above, heat radiation performance is improved due to the metal plate 120. Accordingly, when mounting heat generating components on the rigid circuit boards 100, 110 and 130, there is no possibility that the components, the flexible circuit board 10 and the rigid circuit boards 100, 110 and 130 will be damaged by the heat generated from the components. Therefore, high-density wiring can be obtained, and circuit designing can be freely carried out. Further, when the projecting portion 128 is mounted to a frame (not shown), the heat generated from the components can be dissipated through the metal plate 120 to the frame, thereby effectively preventing the damage of the flexible circuit board 10, etc.

Figure 7:
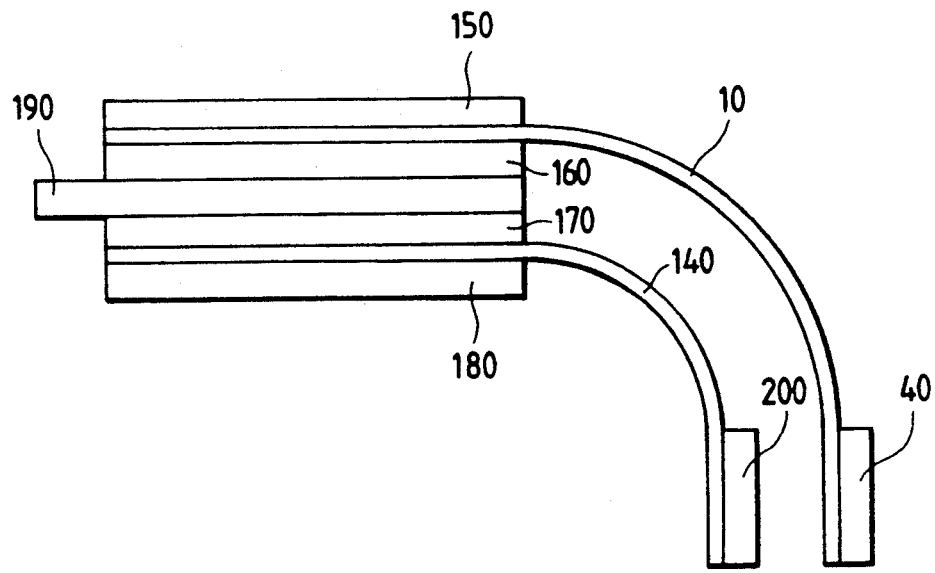
FIG. 7 is a schematic view showing a fourth preferred embodiment of the circuit board device according to the present invention.

FIG. 7 shows a fourth preferred embodiment of the circuit board device according to the present invention. First and second rigid circuit boards 150 and 160 are bonded to one end portion of a flexible circuit board 10, and third and fourth rigid circuit boards 170 and 180 are bonded to one end portion of another flexible circuit board 140. A rigid circuit board 200 is bonded to the other end portion of the flexible circuit board 140. A metal plate 190 is bonded to the second and third rigid circuit boards 160 and 170.

In the fourth preferred embodiment of the circuit board device as described above, heat radiation performance is improved due to the metal plate 190. Accordingly, even when mounting heat generating components on the rigid circuit boards 150, 160, 170 and 180, there is no possibility that the components, the flexible circuit boards 10 and 140 and the rigid circuit boards 150, 160, 170 and 180 will be damaged by the heat generated from the components. Therefore, high-density wiring can be obtained, and circuit designing can be freely carried out.

Although the circuit layers 14, etc. are formed on the opposite surfaces of the resin plate 22, etc., and the circuit layers 93, etc. are formed on the opposite surfaces of the metal plate 90, etc. in the above-mentioned preferred embodiments, such a circuit layer may be formed on one side surface of the resin and/or the metal plate. Further, a plurality of circuit layers may be formed as a multi-layer on the resin plate of the rigid circuit board, so as to obtain higher-density wiring. The metal plate 30, etc. may be formed from an aluminum plate, aluminum alloy plate, iron plate, copper plate, etc.

What is claimed is:

1. A circuit board device comprising:
   a flexible circuit board;
   a rigid circuit board;
   a circuit layer; and a metal plate;
   said rigid circuit board being bonded to at least a part of said flexible circuit board;
   said metal plate being bonded to at least one of (1) said rigid circuit board, and (2) a portion of said flexible circuit board, which portion is itself bonded to said rigid circuit board; and
   said circuit layer being formed directly on one side surface of said metal plate.

2. A circuit board device comprising:
   a flexible circuit board;
   a rigid circuit board;
   a plurality of circuit layers; and
   a metal plate;
   said rigid circuit board being bonded to at least a part of said flexible circuit board;
   said metal plate being bonded to either or both of (1) said rigid circuit board, and (2) a portion of said flexible circuit board, which portion is itself bonded to said rigid circuit board; and
   said plurality of circuit layers being formed on opposite surfaces of said metal plate.

3. A circuit board device comprising:
   a flexible circuit board;
   a rigid circuit board;
   a metal plate;
   a first circuit layer formed on said rigid circuit board; and
   a second circuit layer formed directly on said metal plate;
   said rigid circuit board being bonded to at least a part of said flexible circuit board;
   said metal plate being bonded to at least one of (1) said rigid circuit board, and (2) a portion of said flexible circuit board, which portion is itself bonded to said rigid circuit board; and
   said rigid circuit board and said metal plate being provided with through-holes for connecting said first circuit layer with said second circuit layer.

* * * * *